US008541848B2

(12) United States Patent
Huang et al.

(10) Patent No.: US 8,541,848 B2
(45) Date of Patent: Sep. 24, 2013

(54) HIGH-VOLTAGE MOSFETS HAVING CURRENT DIVERSION REGION IN SUBSTRATE NEAR FIELDPLATE

(75) Inventors: Yun-Pei Huang, Hsinchu (TW); Yi-Feng Chang, Xinbei (TW); Jam-Wem Lee, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/271,342

(22) Filed: Oct. 12, 2011

(65) Prior Publication Data

US 2013/0093010 A1    Apr. 18, 2013

(51) Int. Cl.
*H01L 29/78*    (2006.01)

(52) U.S. Cl.
USPC ........... 257/409; 257/356; 257/355; 257/339; 257/E29.242; 257/E29.255; 257/E29.256

(58) Field of Classification Search
USPC ........................................................ 257/343
See application file for complete search history.

(56) References Cited

U.S. PATENT DOCUMENTS

| | | | |
|---|---|---|---|
| 6,534,829 B2 * | 3/2003 | Sogo et al. | 257/343 |
| 6,570,219 B1 * | 5/2003 | Rumennik et al. | 257/343 |
| 6,844,593 B2 * | 1/2005 | Kikuchi et al. | 257/343 |
| 6,979,864 B2 * | 12/2005 | Negoro et al. | 257/335 |
| 7,776,700 B2 * | 8/2010 | Yang et al. | 438/286 |
| 2012/0205738 A1 * | 8/2012 | Yang et al. | 257/335 |

OTHER PUBLICATIONS

Ellen Lan, et al., "A Field Plate Device by Self-Aligned Spacer Process", Motorola Inc., Microwave and Mixed Signal Technologies Lab, 2004 International Conference on Compound Semiconductor Manufacturing Technology, www.ellenlan.org/timeline.htm p. 1-4.

* cited by examiner

*Primary Examiner* — Julio J Maldonado
*Assistant Examiner* — Molly Reida
(74) *Attorney, Agent, or Firm* — Eschweiler & Associates, LLC

(57) ABSTRACT

To limit or prevent current crowding, various HV-MOSFET embodiments include a current diversion region disposed near a drain region of an HV-MOSFET and near an upper surface of the semiconductor substrate. In some embodiments, the current diversion region is disposed near a field plate of the HV-MOSFET, wherein the field plate can also help to reduce or "smooth" electric fields near the drain to help limit current crowding. In some embodiments, the current diversion region is a p-doped, n-doped, or intrinsic region that is at a floating voltage potential. This current diversion region can push current deeper into the substrate of the HV-MOSFET (relative to conventional HV-MOSFETs), thereby reducing current crowding during ESD events. By reducing current crowding, the current diversion region makes the HV-MOSFETs disclosed herein more impervious to ESD events and, therefore, more reliable in real-world applications.

15 Claims, 4 Drawing Sheets

200

HIGH-VOLTAGE MOSFETS HAVING CURRENT DIVERSION REGION IN SUBSTRATE NEAR FIELDPLATE

BACKGROUND

High-voltage metal oxide semiconductor field effect transistors (HV-MOSFETs) are used in a wide variety of high-voltage applications. They are often used, for example, in voltage supplies, motor controllers, DC to DC converters, and high-end audio amplifiers, among others.

As one of ordinary skill in the art appreciates, an ESD pulse is a sudden and unexpected voltage and/or current discharge that transfers energy to an HV-MOSFET from an outside body (e.g., a human body, which can be approximated in modeling by a human body model (HBM)). ESD pulses can damage HV-MOSFETs, for example by "melting" an active region area in cases of high current, causing junction failure. If devices are damaged by an ESD pulse, a HV-MOSFET can be rendered less operable than desired, or can even be rendered inoperable altogether.

The inventors have appreciated that conventional HV-MOSFETs are more susceptible to electrostatic discharge pulses (ESD pulses) than designers would like. In view of the above, the inventors have devised HV-MOSFETs having improved ESD protection.

DETAILED DESCRIPTION

Figure 1:
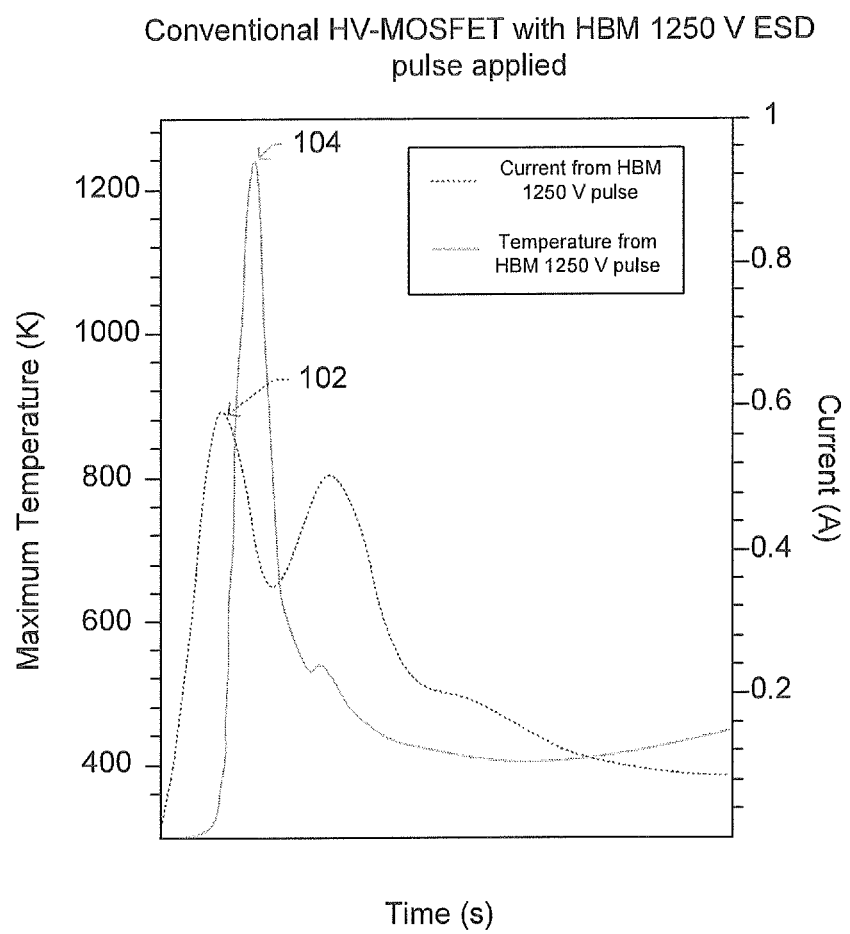
FIG. 1 shows a chart depicting temperature and current of a conventional HV-MOSFET in the wake of an ESD event.

One or more implementations of the present invention will now be described with reference to the attached drawings, wherein like reference numerals are used to refer to like elements throughout. The drawings are not necessarily drawn to scale.

To illustrate some shortcomings with conventional HV-MOSFETs as appreciated by the inventors, reference is now made to FIG. 1. FIG. 1 depicts current levels and maximum temperature levels in a conventional HV-MOSFET device in the wake of a 1250 V ESD pulse (HBM). Shortly after the on-set of the ESD pulse, the HV-MOSFET experiences large current "spikes" 102 as it attempts to dissipate the energy of the ESD pulse. In studying conventional HV-MOSFETs, the inventors have appreciated that when a sufficient carrier density (e.g., current spike 102) flows through the HV-MOSFET (e.g., due to the ESD pulse), the carriers can "crowd" together near at an upper surface of the substrate as they approach the drain. This current crowding can lead to a corresponding temperature spike 104, which can melt this region of the device and thereby cause irreparable harm to the HV-MOSFET.

To limit or prevent this current crowding, various HV-MOSFET embodiments described below include a current diversion region disposed near a drain region of the HVMOS-FET. In some embodiments, the current diversion region is disposed near an upper surface of the semiconductor substrate and near a field plate of the HV-MOSFET, wherein the field plate can also help to reduce or "smooth" electric fields near the drain to help limit current crowding. In some embodiments, the current diversion region is a p-doped, n-doped, or intrinsic region that is at a floating voltage potential. This current diversion region can push current deeper into the substrate of the HV-MOSFET (relative to conventional HV-MOSFETs), thereby reducing current crowding during ESD events. By reducing current crowding, the current diversion region makes the HV-MOSFETs disclosed herein more impervious to ESD events and, therefore, more reliable in real-world applications.

Figure 2:
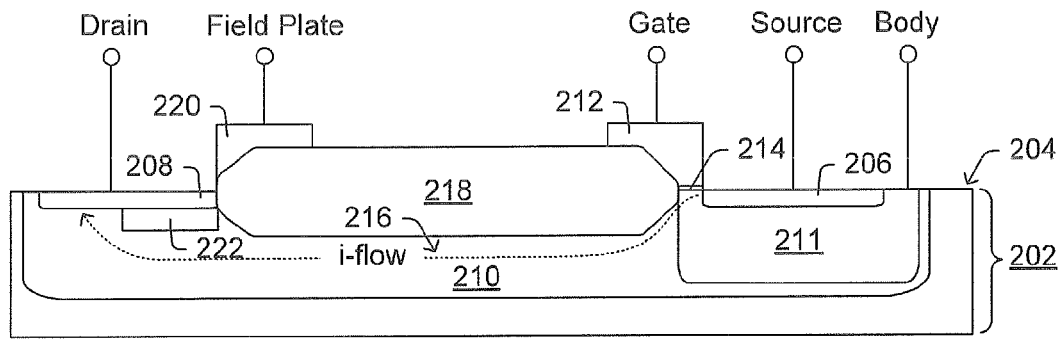
FIG. 2 shows a cross-sectional view of a HV-MOSFET semiconductor device in accordance with some embodiments.

Turning now to FIG. 2, one can see a HV-MOSFET 200 in accordance with some embodiments. The HV-MOSFET 200 is formed on a semiconductor substrate 202 having an upper surface 204. A source region 206 and drain region 208, which have a first doping type (e.g., n-type), are disposed in the semiconductor substrate 202 near the upper substrate surface 204. A first well region 210, which has the first doping type (e.g., n-type), and a second well region 211, which has a second doping type that is opposite of the first doping type, are also formed in the semiconductor substrate 202. A conductive gate electrode 212, which is often made of polysilicon or metal, is disposed over the substrate 202. To provide electrical isolation, a gate dielectric 214 is sandwiched between the gate electrode 212 and the second well region 211. A drain extension region 216, which has the first doping type (e.g., n-type), is disposed in the semiconductor substrate 202 between the second well region 211 and the drain 208. A field oxide region 218, which has a thickness that is greater than a thickness of the gate dielectric 214, is disposed over the drain extension region 216. A conductive field plate 220, which is typically made of poly or metal, is disposed over a portion of the field oxide 218 near the drain 208. A current diversion region 222 is disposed in the substrate 202 near the upper substrate surface 204 between the drain extension region 216 and the drain 208. To divert current, the current diversion region 222 can have the second conductivity type (e.g., p-type) or have an intrinsic carrier concentration of the substrate. In some embodiments, the current diversion region 222 can be a non-silicide region that is electrically floating.

During operation, the HVMOS 200 can be in an on-state (conducting/low-resistance state between source 206 and drain 208) or an off-state (non-conducting/high-resistance state between source 206 and drain 208), depending on the bias applied to the device 200. To achieve the on-state, a gate voltage greater than a predetermined voltage threshold ($V_{TH}$) can be applied to the gate 212 relative to the source 206. This relatively high gate-to-source voltage ($V_{GS}$) forms a depletion region in the second well 211 under the gate 212, which causes majority carriers (e.g., electrons) from the source 206 to flow into the depletion region, thereby creating a channel region with a high concentration of mobile majority carriers. When a voltage bias is applied between the source and drain ($V_{DS}$), these mobile carriers in the channel region drift through the drain extension region 216 and into the drain 208 (e.g., as indicated by arrow "i-flow"). To achieve the off-state, $V_{is}$ is driven lower than $V_{TH}$, and few or no mobile carriers are present in the channel region, such that a high-resistance is seen between source 206 and drain 208.

When carriers are present in the channel region (e.g., when $V_{GS}$ is higher than $V_{TH}$ or during an ESD event), most majority carriers find it easier to go around the current diversion region 222 than go through it. This is because the current diversion region 222 can comprise substrate material having the second conductivity type, which is opposite the first conductivity of the drain extension region 216. Consequently, the current diversion region 222 represents a large energetic barrier, relative to the surrounding first well 210. As previously mentioned, in conventional HV-MOSFETs (which do not include a current diversion region 222), current can crowd into the drain 208 near the junction of the drain 208 and field oxide 218 in the wake of an ESD event, thereby causing sudden temperature spikes in this region. The current diversion region 222, in contrast, effectively forces current deeper into the substrate 202 before it can enter the drain 208, thereby helping to avoid current crowding and overheating.

The field plate 220 also helps to limit the electric field intensity near the drain 208. The field plate 220 can be held at a lower voltage (relative to the gate 212) or can be tied to the drain 208. In either case, the field plate 220 lessens electric field intensity near the drain 208, which helps to limit hot carrier effects.

Figure 3:
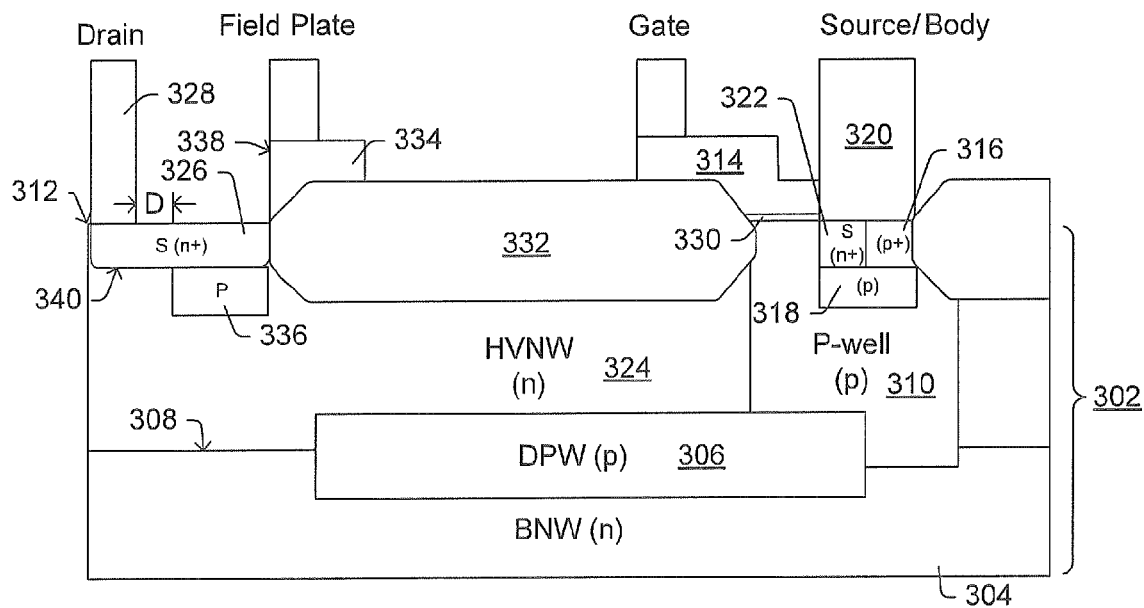
FIG. 3 shows a cross-sectional view of a HV-MOSFET semiconductor device in accordance with some embodiments.

Turning now to FIG. 3, one can see another HV-MOSFET semiconductor device 300 in accordance with some embodiments. Although this HV-MOSFET 300 is described below with regards to some regions that are n-type (e.g., 304, 322, 324, 326) and other regions that are p-type (e.g., 306, 310, 316, 318), the polarity of the illustrated doping types can be flipped in other embodiments. N-type regions may include intrinsic silicon doped with Group 15 elements such as phosphorus or arsenic, for example, while p-type regions may include intrinsic silicon doped with Group 13 elements such as boron, for example.

HV-MOSFET 300 is formed on a semiconductor substrate 302, which is typically a silicon wafer or silicon-on-insulator (SOI) wafer. The substrate 302 includes a buried n-region 304. This buried n-region 304 can be an n-doped wafer as received from a wafer distributor, for example, or can be an n-EPI layer or some other n-well buried in the substrate 302.

A deep p-well 306 is formed over the buried n-well 304. The deep p-well 306 extends laterally near a top surface 308 of the buried n-well 304.

A p-well 310, which acts as the body of the HV-MOSFET 300, extends from near upper substrate surface 312 down to the deep p-well 306. The p-well 310 also extends laterally under a conductive gate electrode 314.

A body contact, which comprises a highly doped surface implant region 316 and a deeper and lesser doped implant region 318 (both of which are p-type), helps provide an ohmic contact between a source/body contact 320 and the p-well 310. The source/body contact 320 is often made of polysilicon or various metals (e.g., tungsten, aluminum, copper).

The source/body contact is also electrically coupled (e.g., ohmically coupled) to a source region 322. The source region 322 is a highly doped n-type region. The source region 322 is formed in the p-well 310 near the upper substrate surface 312. Typically, the source region 322 is self-aligned with the gate electrode 314.

A high-voltage n-well 324, which acts as a drain extension region to help to dissipate large voltages over the HV-MOSFET, laterally abuts the p-well 310 on one side. The high-voltage n-well 324 also has a lower surface that abuts the deep p-well 306 and buried n-well 304.

A drain 326, which is a highly doped n-type region, is formed in the high-voltage n-well 324 near the upper substrate surface 312. A drain contact 328 is coupled (e.g., ohmically coupled) to the drain, and is often made of polysilicon or various metals (e.g., tungsten, aluminum, copper).

A gate dielectric region 330 provides electrical isolation between the gate electrode 314 and p-well 310. A field oxide region 332 can abut the gate dielectric region 330, and is disposed between the source 322 and drain 326. Often the gate dielectric 330 and field oxide 332 are made of silicon dioxide.

The gate electrode 314 is often made of polysilicon, although it could also be made out of metal. A field plate 334, which is often made of polysilicon or metal, is disposed on an opposite side of the field oxide 332 relative to the gate electrode 314. Unlike the gate electrode 314 (which has a relatively thin gate dielectric 330 isolating it from the substrate 302), the field plate 334 has a relatively thick field oxide 332 separating it from the substrate 302. Because of this, the potential due to the field plate often is used to make only slight adjustments to the electric field under the field oxide 332 near the drain 326.

A current diversion region 336, which is a p-type region disposed adjacent to the drain 326 and the high-voltage n-well 324, diverts current flow to limit current crowding. The current diversion region 336 is often self-aligned with respect to a vertical edge 338 of the field plate 334, and is disposed under a lower surface 340 of the drain 326. To keep the current diversion region 336 floating, the current diversion region 336 is spaced apart from the drain contact 328 by a distance, D.

Figure 4:
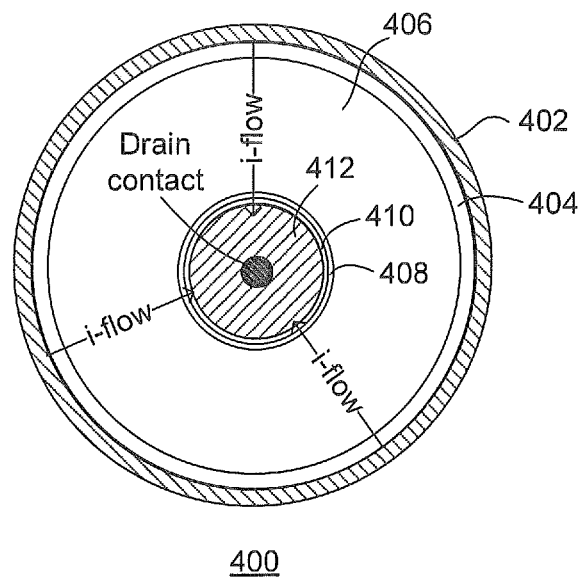
FIG. 4 shows a top view of a ring-shaped HV-MOSFET semiconductor device in accordance with some embodiments.

Turning now to FIG. 4, one can see a top view of a HV-MOSFET device that has a ring configuration. In such a configuration, the curved surfaces of the device help to limit "kinks" in the electric field, which might otherwise arise due to sharp corners associated with rectangular devices. For purposes of clarity, not all layers are shown.

In FIG. 4's embodiment, a ring-shaped source 402 defines the outer perimeter of the device 400. A gate electrode 404 is disposed adjacent to the source 402, and extends concentrically along an inner edge of the source 402. A field oxide 406 is adjacent to the gate electrode 404 and concentrically therein, and a field plate 408 extends along an inner edge of the field oxide 406. A floating current diversion region 410 is near the edge of the field plate 408 (e.g., self-aligned with the field plate 408), and is adjacent to a central drain region 412. During operation, current can flow from the source 402 under the gate electrode 404 and to the drain 412 (e.g., as shown by i-flow), based on the bias applied to the device.

Figure 5:
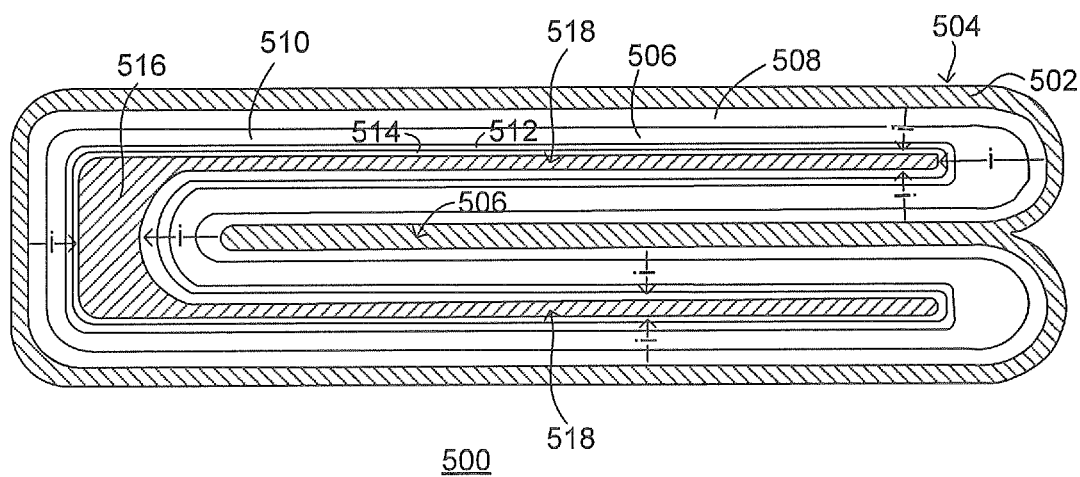
FIG. 5 shows a top view of a finger-type HV-MOSFET semiconductor device in accordance with some embodiments.

FIG. 5 shows a top view of another embodiment of a HV-MOSFET 500. This embodiment is a "finger style" configuration. In this embodiment, the source 502 has an outer periphery 504 and a finger 506 extending inwardly therefrom. A gate electrode 508 is disposed along the inner perimeter of the source 502. A field oxide 510 is adjacent to the gate electrode 508 and concentrically therein, and a field plate 512 extends along an inner edge of the field oxide 510. A floating current diversion region 514 is near the edge of the field plate 512 (e.g., self-aligned with the field plate 512), and is adjacent to a drain region 516. The drain region 516 has inter-digitated members 518 which are disposed between the source finger 506 and the source outer periphery 504. During operation, current can flow from the source 502 under the gate 508 and to the drain 516 (e.g., as shown by i-flow), based on the bias applied to the device. In other embodiments, the source 502 can have multiple fingers 506 and multiple inter-digitated drain members 518 can be disposed between the multiple fingers 506, respectively.

Depending on the design rules for the minimum opening of the source and minimum size of the gate, designers may choose to use varying shape source cells to achieve desired device performance. Previous figures display only a few possible geometries of source cells, but the inventors have contemplated the use of many varying shapes of source cells in conjunction with the present invention (e.g., hexagonal).

Figure 6:
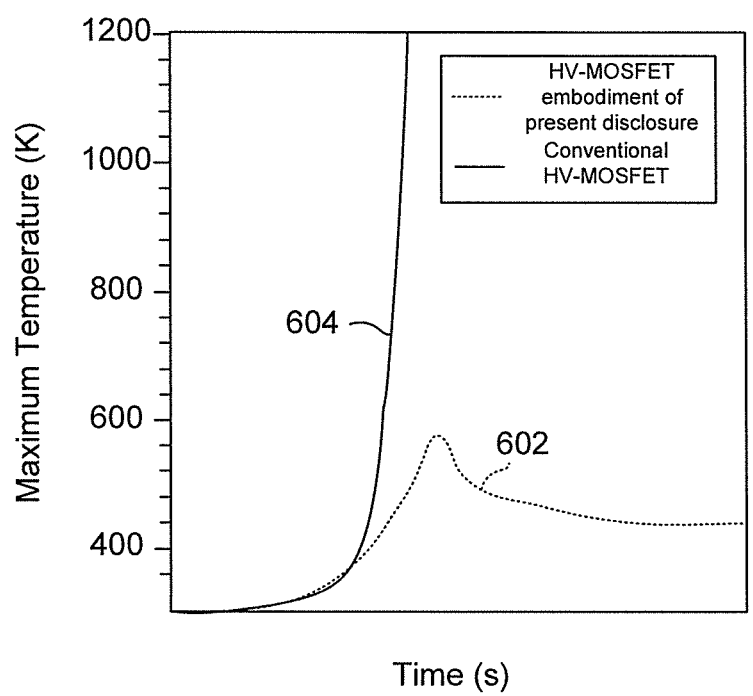
FIG. 6 shows a chart depicting temperature and current of a HV-MOSFET in accordance with some embodiments in the wake of an ESD event.

FIG. 6 depicts maximum temperature excursions of one embodiment of a HV-MOSFET in the wake of a 1250 V ESD pulse, compared to a conventional HV-MOSFET device. It will be appreciated that these simulated results are not indicative of every embodiment of the present disclosure nor are they indicative of every conventional HV-MOSFET device. As can be seen, the temperature excursions in accordance with some embodiments 602 are curtailed relative to those in conventional HV-MOSFET devices 604.

It will be appreciated that identifiers such as "first" and "second" do not imply any type of ordering or placement with respect to other elements; but rather "first" and "second" and other similar identifiers are just generic identifiers. Thus, there is not necessarily a one-to-one correspondence between the terms "first" and "second" between the claims and detailed description, as some identifiers may be switched for the sake of proper numerical ordering, for example, in the claims. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device, which is disposed on a semiconductor substrate having an upper surface, the semiconductor device comprising:
a source region disposed near the upper surface of the semiconductor substrate and having a first conductivity type;
a drain disposed near the upper surface of the semiconductor substrate and having the first conductivity type, the drain spaced apart from the source region;
a field oxide region disposed over the upper surface of the semiconductor substrate between the source and the drain;
a gate electrode disposed over the upper surface of the semiconductor substrate and disposed between the field oxide region and the source, wherein a gate dielectric is sandwiched between the gate electrode and the upper surface of the semiconductor substrate to provide electrical isolation there between;
a current diversion region disposed in the semiconductor substrate under a portion of the drain nearest the source region, the current diversion region having a second conductivity type opposite the first conductivity type and arranged to divert current flow between source and drain thereunder to limit current crowding at the portion of the drain nearest the source region; and
a conductive field plate disposed over a portion of the field oxide near the drain, wherein the current diversion region is self-aligned with respect to the conductive field plate.

2. The semiconductor device of claim 1, wherein the current diversion region is arranged under the drain.

3. The semiconductor device of claim 1, wherein the current diversion region abuts a lower region of the drain.

4. The semiconductor device of claim 1, where current diversion region is electrically floating.

5. The semiconductor device of claim 1, wherein a current path extends between the source region and the drain, the current path extending from the source region under the gate electrode, under the field oxide, and under the current diversion region to a second portion of the drain, wherein the current diversion region does not extend under the second portion of the drain.

6. A semiconductor device, which is disposed on a semiconductor substrate having an upper surface, the semiconductor device comprising:
a first well disposed in the semiconductor substrate and having a first conductivity type;
a second well disposed within the first well and having a second conductivity type;
a source region disposed in the second well near the upper surface of the semiconductor substrate and having the first conductivity type;
a drain disposed in the first well and spaced apart from the source and the second well, wherein the drain is disposed near the upper surface of the semiconductor substrate and has the first conductivity type;
a field oxide region disposed over the upper surface of the semiconductor substrate between the drain and the second well;
a gate electrode disposed over the upper surface of the semiconductor substrate and disposed between the field oxide region and the source, wherein a gate dielectric is sandwiched between the gate electrode and the upper surface of the semiconductor substrate to provide electrical isolation there between;
a current diversion region disposed in the first well under a portion of the drain nearest the source region, the current diversion region having the second conductivity type and arranged to divert current flow between source and drain thereunder to limit current crowding at the portion of the drain nearest the source region; and
a conductive field plate disposed over a portion of the field oxide near the drain, wherein the current diversion region is self-aligned with respect to the conductive field plate.

7. The semiconductor device of claim 6, wherein the current diversion region is under the drain.

8. The semiconductor device of claim 6, wherein the current diversion region abuts a lower region of the drain.

9. The semiconductor device of claim 6, where current diversion region is electrically floating.

10. The semiconductor device of claim 6, further comprising:
 a drain contact extending upwardly from the drain and providing an ohmic contact thereto.

11. The semiconductor device of claim 10, where the current diversion region is spaced apart from the drain contact by a predetermined distance.

12. A semiconductor device, which is disposed on a semiconductor substrate having an upper surface, the semiconductor device comprising:
 a buried well disposed in the semiconductor substrate and having a first conductivity type;
 a deep-well disposed abuttingly over the buried well and having a second conductivity type opposite the first conductivity type;
 a high-voltage well disposed abuttingly over the deep well and having the first conductivity type;
 a body well having the second conductivity type and extending downwardly from the upper substrate surface to the deep well and laterally abutting the high-voltage well;
 a source disposed in the body well near the upper substrate surface and having the first conductivity type;
 a drain disposed in the high-voltage well and spaced apart from the source and the body well, wherein the drain is disposed near the upper substrate surface and has the first conductivity type;
 a current diversion region disposed in the high-voltage well under a portion of the drain nearest the source, the current diversion region having the second conductivity type and arranged to divert current flow between source and drain thereunder to limit current crowding near the portion of the drain nearest the source; and
 a conductive field plate disposed over a portion of the field oxide near the drain, wherein the current diversion region is self-aligned with respect to the conductive field plate.

13. The semiconductor device of claim 12, wherein the current diversion region abuts a lower region of the drain.

14. The semiconductor device of claim 12, further comprising:
 a field oxide region disposed over the upper surface of the semiconductor substrate between the drain and the body well.

15. The semiconductor device of claim 14, further comprising:
 a gate electrode disposed over the upper surface of the semiconductor substrate and disposed between the field oxide region and the source, wherein a gate dielectric is sandwiched between the gate electrode and the upper surface of the semiconductor substrate to provide electrical isolation there between.

* * * * *